US012727097B2

(12) United States Patent
Luo et al.

(10) Patent No.: US 12,727,097 B2
(45) Date of Patent: Sep. 1, 2026

(54) DISPLAY APPARATUS AND ELECTRONIC DEVICE

(71) Applicant: HKC CORPORATION LIMITED, Shenzhen (CN)

(72) Inventors: Fei Luo, Shenzhen (CN); Junfeng Xie, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 175 days.

(21) Appl. No.: 18/887,057

(22) Filed: Sep. 17, 2024

(65) Prior Publication Data

US 2025/0107021 A1 Mar. 27, 2025

(30) Foreign Application Priority Data

Sep. 27, 2023 (CN) ......................... 202311256884.2

(51) Int. Cl.
*H05K 5/02* (2006.01)
*F42B 3/04* (2006.01)

(52) U.S. Cl.
CPC ............. *H05K 5/0217* (2013.01); *F42B 3/04* (2013.01)

(58) Field of Classification Search
CPC ... F23Q 13/00; F42B 3/04; G09F 9/30; H05K 5/0217
USPC .......................................................... 361/247
See application file for complete search history.

(56) References Cited

FOREIGN PATENT DOCUMENTS

| | | | | | |
|---|---|---|---|---|---|
| CN | 102897133 A | | 1/2013 | | |
| CN | 103479028 A | | 1/2014 | | |
| CN | 106790875 A | * | 5/2017 | ............ H04M 1/185 |
| CN | 206969960 U | | 2/2018 | |
| CN | 208036204 U | | 11/2018 | |
| CN | 214619677 U | | 11/2021 | |
| CN | 116238430 A | * | 6/2023 | ......... B60R 11/0229 |
| JP | H0558516 U | * | 8/1993 | |
| JP | 2004175154 A | * | 6/2004 | |

OTHER PUBLICATIONS

Machine translation of Yang et al. Chinese Patent Document CN 106790875 A May 2017 (Year: 2017).*

Machine translation of Luo Chinese Patent Document CN 116238430 A Jun. 2023 (Year: 2023).*

(Continued)

*Primary Examiner* — Kevin J Comber

(57) ABSTRACT

A display apparatus and an electronic device are provided. The display apparatus includes a display panel, a protection housing, an ignition assembly, and a protection assembly. The display panel is arranged in the protection housing, and the protection housing includes a cooperating chamber, the protection assembly includes a compressible airbag and an ignition material, the cooperating chamber includes a gas chamber and a storage space, the gas chamber is communicated with the storage space, the storage space is configured to accommodate the ignition material, and the compressible airbag seals an opening of the gas chamber. The ignition assembly is connected to the protection housing, the ignition assembly includes an ignition leading-wire and an ignition leading-ball, one end of the ignition leading-wire is connected to the storage space, and the ignition leading-ball is configured to contact with the other end of the ignition leading-wire.

14 Claims, 5 Drawing Sheets

(56) References Cited

OTHER PUBLICATIONS

Machine translation of Takahashi et al. Japanese Patent Document JP 2004-175154 A Jun. 2004 (Year: 2004).*
Machine translation of Hashimoto Japanese Patent Document JP H05-58516 U Aug. 1993 (Year: 1993).*
Chinese First Office Action, Chinese Application No. 202311256884.2, mailed Nov. 10, 2023 (13 pages).
Chinese Notification to Grant Patent Right for Invention, Chinese Application No. 202311256884.2, mailed Nov. 24, 2023 (5 pages).

* cited by examiner

DISPLAY APPARATUS AND ELECTRONIC DEVICE

CROSS REFERENCE TO RELATED APPLICATIONS

The present disclosure claims priority to Chinese Patent Application No. 202311256884.2 filed Sep. 27, 2023, the contents of which are herein incorporated by reference in its entirety.

TECHNICAL FIELD

The present disclosure relates to the field of device protection technologies, in particular to a display apparatus and an electronic device.

BACKGROUND

With continuous development of times and technologies, various devices have made great progress in technologies, and the probability of device damage due to performance failures has decreased. Therefore, fall protection for the devices has become an important direction of device protection.

In the related art, a protection housing or sleeve is configured to wrap a display apparatus of a device to provide additional cushion and protection for the fall protection. However, the protection housing or sleeve increases the size and weight of the display apparatus, making it bulkier and less portable. The protection housing or sleeve may also reduce heat dissipation capability of the device, leading to overheating of the display apparatus. Prolonged overheating may have a negative impact on the performance and lifespan of the display apparatus and the device.

SUMMARY

A display apparatus is provided and includes a display panel, a protection housing, an ignition assembly, and a protection assembly. The display panel is arranged in the protection housing, and the protection housing includes a cooperating chamber, the protection assembly includes a compressible airbag and an ignition material, the cooperating chamber includes a gas chamber and a storage space, the gas chamber is communicated with the storage space, the storage space is configured to accommodate the ignition material, and the compressible airbag seals an opening of the gas chamber. The ignition assembly is connected to the protection housing, the ignition assembly includes an ignition leading-wire and an ignition leading-ball, one end of the ignition leading-wire is connected to the storage space, and the ignition leading-ball is configured to contact with the other end of the ignition leading-wire to ignite the ignition material, so as to increase the air pressure in the gas chamber to inflate the compressible airbag.

An electronic device is provided and includes a power supply and a display apparatus. The power supply is configured to power the display apparatus. The display apparatus includes a display panel, a protection housing, an ignition assembly, and a protection assembly. The display panel is arranged in the protection housing, and the protection housing includes a cooperating chamber, the protection assembly includes a compressible airbag and an ignition material, the cooperating chamber includes a gas chamber and a storage space, the gas chamber is communicated with the storage space, the storage space is configured to accommodate the ignition material, and the compressible airbag seals an opening of the gas chamber. The ignition assembly is connected to the protection housing, the ignition assembly includes an ignition leading-wire and an ignition leading-ball, one end of the ignition leading-wire is connected to the storage space, and the ignition leading-ball is configured to contact with the other end of the ignition leading-wire to ignite the ignition material, so as to increase the air pressure in the gas chamber to inflate the compressible airbag.

BRIEF DESCRIPTION OF THE DRAWINGS

The drawings here are incorporated into the specification and form a part of the specification. The drawings illustrate some embodiments in accordance with the present disclosure and are used together with the specification to describe the technical solutions of the present disclosure.

DETAILED DESCRIPTIONS

Figure 1:
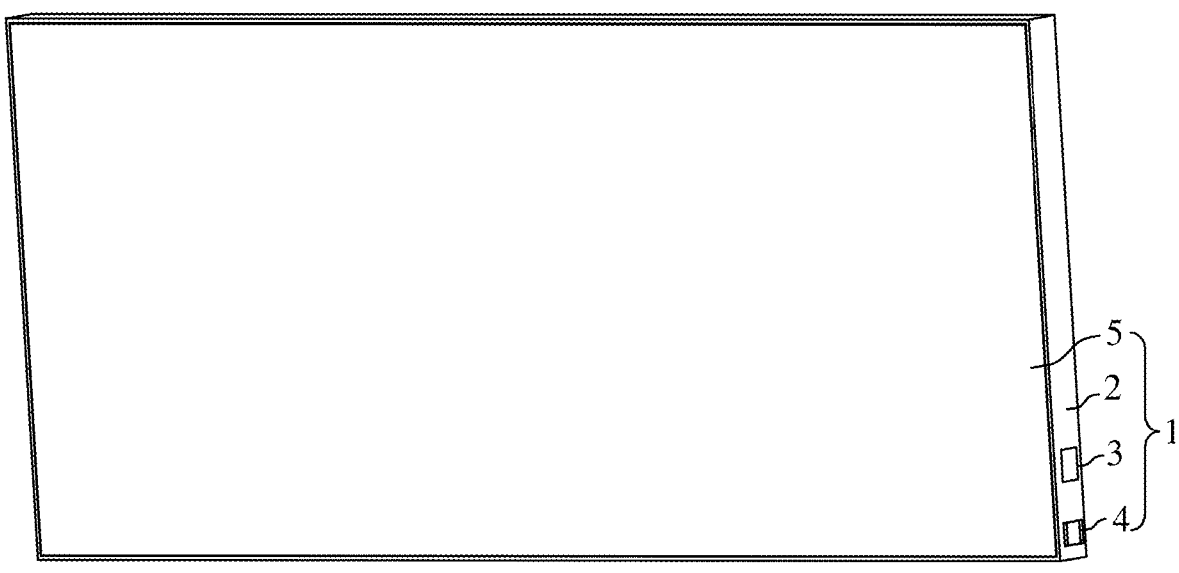
FIG. 1 is a structural schematic view of a display apparatus according to some embodiments of the present disclosure.

The technical solutions in some embodiments of the present disclosure are described in conjunction with the drawings. The following embodiments are only intended to clearly describe the technical solutions of the present disclosure, and therefore are only used as examples and cannot be used to limit the scope of the present disclosure.

Unless otherwise defined, all technical and scientific terms used in embodiments of the present disclosure have the same meanings as those commonly understood by those skilled in the art. The terms used in in embodiments of the present disclosure are only for the purpose of describing embodiments and are not intended to limit the present disclosure. The terms “include” and “have”, and any variations thereof in the description, claims, and the drawings are intended to cover non exclusive inclusion.

In the embodiments of the present disclosure, terms “first” and “second” are only used to distinguish different objects, and cannot be understood as indicating or implying relative importance or implying the number, specific order, or primary-secondary relationship of the indicated technical features. In the embodiments of the present disclosure, "multiple" means two or more, unless otherwise defined. A specific feature, a structure, or a characteristic described in conjunction with some embodiments may be included in at least one embodiment of the present disclosure. Some embodiments include a phrase appearing in various positions in the specification does not necessarily refer to the same embodiment, and does not independents or alternative embodiment that are mutually exclusive with other embodiments. Those skilled in the art explicitly and implicitly understand that the embodiments described in the present disclosure may be combined with other embodiments.

In the embodiments of the present disclosure, a term "and/or" is just an association relationship that describes association objects, indicating that there may be three kinds of relationships, for example, A and/or B may indicate that there are three cases: A alone, A and B together, and B alone. In addition, the character "/" generally indicates that front and back associated objects are an "or" relationship.

In the embodiments of the present disclosure, a term "multiple" refers to two or more (including two), similarly, a term "multiple groups" refers to two or more groups (including two groups), and a term "multiple pieces" refers to two or more pieces (including two pieces).

In the embodiments of the present disclosure, technical terms "center", "longitudinal", "latitudinal", "length", "width", "thickness", "above", "under", "front", "back", "left", "right", "vertical", "horizontal", "top", "bottom", "inside", "outside", "clockwise", "counterclockwise", "axial", "radial", "circumferential", etc. indicate an orientation or position relationship based on an orientation or position relationship shown in the drawings, theses technical terms are only for the convenience of describing the embodiments of the present disclosure and simplifying the description, and not to indicate or imply that a device or component referred to must have a specific orientation, be constructed and operated in a specific orientation. Therefore, theses technical terms cannot be understood as limit to the present disclosure.

In the embodiments of the present disclosure, unless otherwise defined and limited, technical terms such as "installation", "joint", "connection", and "fixation", etc. should be broadly understood, for example, they may be fixed connections, detachable connections, or integrated, they may also be a mechanical connection or an electrical connection. They may be directly connected or indirectly connected through an intermediate medium. They may be internal connection of two components or an interaction relationship between two components. For those skilled in the art, the specific meanings of the above terms in the embodiments of present disclosure may be understood in specific circumstances.

As shown in FIG. 1, FIG. 1 is a structural schematic view of a display apparatus according to some embodiments of the present disclosure.

A display apparatus 1 in some embodiments of the present disclosure includes: a protection housing 2, an ignition assembly 3, a protection assembly 4, and a display panel 5. The ignition assembly 3 and protection assembly 4 are all connected to the protection housing 2, and the ignition assembly 3 is connected to the protection assembly 4.

The display panel 5 may be a liquid crystal display (LCD) display panel, a light emitting diode display (LED) display panel, an organic light emitting diode display (OLED) display panel, a cathode ray tube (CRT) display panel, a curved display panel (CDP), or a flexible display panel (FDP), etc.

The protection housing 2 may be in a shape of rectangular, square, curved, or customized, etc. made of plastic (such as polycarbonate), metal alloys (such as aluminum alloy and steel), or other materials. The protection housing 2 may be configured to provide a physical barrier for the display panel 5, protect the display panel 5 from external collisions, scratches, and vibrations, reduce a risk of accidental impact or fall causing rupture and damage to the display panel 5, and provide a stable structure for the display panel 5 to prevent bending or deformation.

Figure 2:
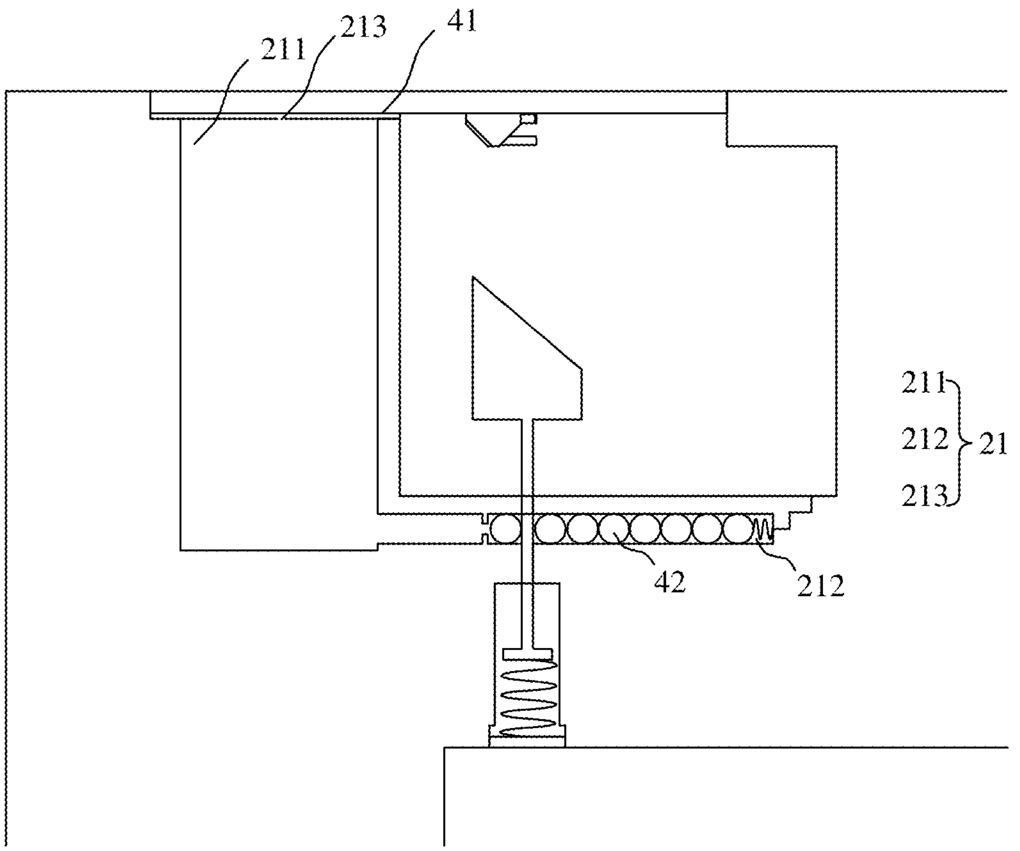
FIG. 2 is a structural schematic view of a protection housing and a protection assembly according to some embodiments of the present disclosure.

As shown in FIG. 2, FIG. 2 is a structural schematic view of a protection housing and a protection assembly according to some embodiments of the present disclosure.

The protection housing 2 may include a cooperating chamber 21, which includes a gas chamber 211, a storage space 212, and an opening 213 of the gas chamber 211. The gas chamber 211 may be defined in a cube-shaped, or in a shape of rectangular, etc., and is communicated with the storage space 212 to store gas generated in the storage space 212. The storage space 212 may be defined in shapes of cylindrical or rectangular, and is configured to accommodate an ignition material 42. The opening 213 of the gas chamber 211 may be defined in a shape of circular, square, or elliptical, or other shapes to transmit the gas generated in the storage space 212 and gas stored in the gas chamber 211.

The protection assembly 4 may include a compressible airbag 41 and the ignition material 42. The compressible airbag 41 may be made of a material with good elasticity and resilience, such as neoprene, nitrile rubber, elastic polymer, or silicone, etc. The compressible airbag 41 is configured to expand to form a soft protection environment through the gas generated by a reaction of the ignition material 42 when the display panel 5 falls, so as to cushion the display panel 5 from an impact force and reduce the possibility of the display panel 5 being directly collided. After the fall occurs, the compressible airbag 41 may seal the opening 213 of the gas chamber 211. It should be noted that the ignition material 42 may be a compound such as sodium azide that may produce gas.

Figure 3:
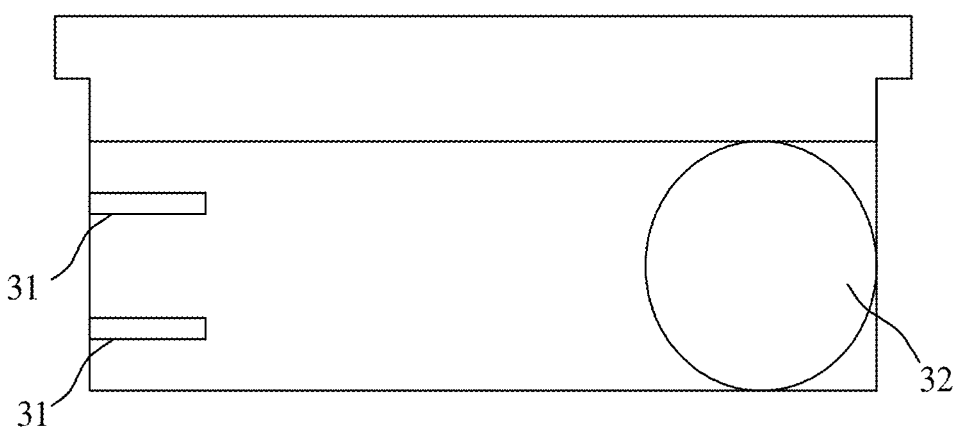
FIG. 3 is a structural schematic view of an ignition assembly according to some embodiments of the present disclosure.

As shown in FIG. 3, FIG. 3 is a structural schematic view of an ignition assembly according to some embodiments of the present disclosure.

The ignition assembly 3 may include an ignition leading-wire 31 and an ignition leading-ball 32. The ignition leading-wire 31 may be made of a metal material with good conductivity, such as copper, or steel alloy, etc. One end of ignition leading-wire 31 is connected to the storage space 212, and is configured to transmit a fall signal to the storage space 212, such that the ignition material 42 in the storage space 212 reacts and produces gas. The ignition leading-ball 32 may be made of a magnetic material, such as barium ferrite magnet, or magnetic rubber, etc., and is configured to contact with the other end of the ignition leading-wire 31 when sensing the fall and enable the ignition leading-wire 31, such that the fall signal is transmitted to the storage space 212 through the ignition leading-wire 31, the ignition material 42 is ignited, the air pressure in the gas chamber 211 is increased to inflate the compressible airbag 41.

For example, when the ignition leading-ball 32 in the ignition assembly 3 senses the fall of the display panel 5, it contacts with and enable the ignition leading-wire 31. The fall signal is transmitted, through the ignition leading-wire 31, to the storage space 212 connected to the ignition leading-wire 31, and the ignition material 42 in the storage space 212 is ignited. The ignition material 42 produces a large amount of gas, which is transmitted to the gas chamber 211 connected to the storage space 212 under the action of air pressure. The generated gas is then transmitted to the compressible airbag 41 connected to the gas chamber 211 through the opening 213 of the gas chamber 211. After inflation, the compressible airbag 41 rapidly expands to form an airbag that acts as a cushion for the display panel 5.

In the above solutions, the display apparatus 1 includes the protection housing 2, the ignition assembly 3, the protection assembly 4, and the display panel 5. The display panel 5 is arranged in the protection housing 2, and the protection housing 2 includes the cooperating chamber 21. The protection assembly 4 includes the compressible airbag 41 and the ignition material 42. The cooperating chamber 21 includes the gas chamber 211 and the storage space 212. The gas chamber 211 is communicated with the storage space 212, and the storage space 212 is configured to accommodate the ignition material 42. The compressible airbag 41 is configured to seal the opening 213 of the gas chamber 211. The ignition assembly 3 is connected to the protection housing 2, and the ignition assembly 3 includes the ignition leading-wire 31 and the ignition leading-ball 32. The one end of ignition leading-wire 31 is connected to storage space 212, and ignition leading-ball 32 is configured to contact with the other end of the ignition leading-wire 31, such that the ignition leading-wire 31 ignites the ignite ignition material 42 to increase the air pressure in chamber 211 to inflate compressible airbag 41. In this way, when the protection assembly 4 experiences a gravity imbalance, the ignition leading-ball 32 will contact with the ignition leading-wire 31 due to the influence of gravity, causing the ignition leading-wire 31 to ignite the ignition material 42, thereby increasing the air pressure of chamber 211 to inflate the compressible airbag 41. After inflation, the compressible airbag 41 expands. The expanded compressible airbag 41 provides good protection for the protection housing 2. In addition, the above assemblies have simple structures that do not excessively increase the overall weight of the display apparatus 1, making the display apparatus 1 easy to be protected and make the display apparatus 1 lightweight.

Figure 4:
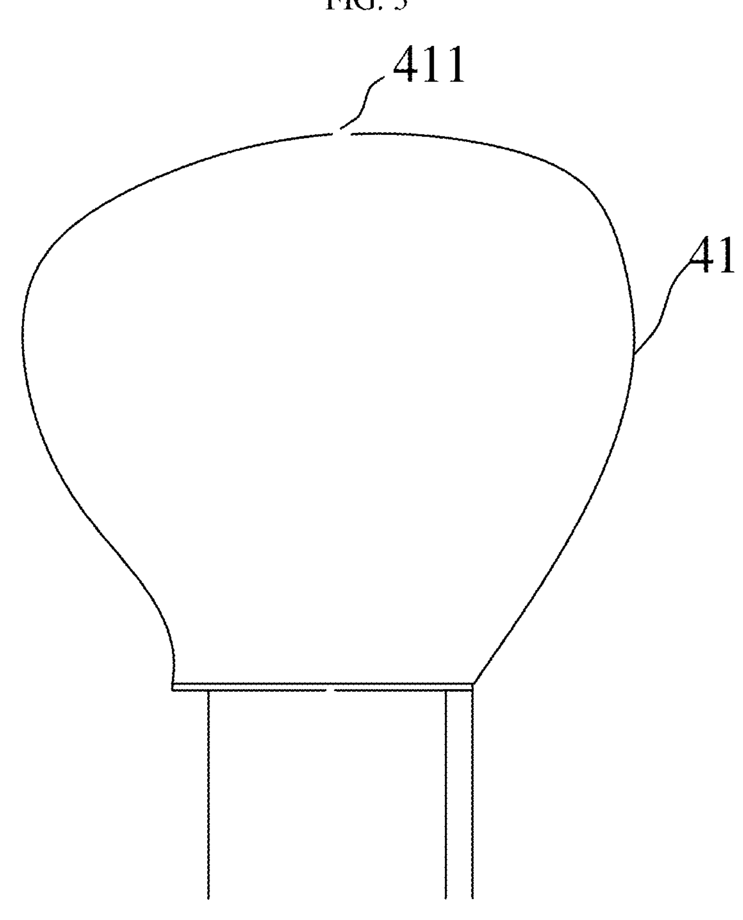
FIG. 4 is a structural schematic view of an inflated compressible airbag according to some embodiments of the present disclosure.

As shown in FIG. 4, FIG. 4 is a structural schematic view of an inflated compressible airbag according to some embodiments of the present disclosure.

The compressible airbag 41 may include a gas leakage hole 411, which may be defined in a shape of circular, elliptical, or other shapes to deflated the gas in the compressible airbag 41, causing the inflated compressible airbag 41 to return to an uninflated state.

Figure 5:
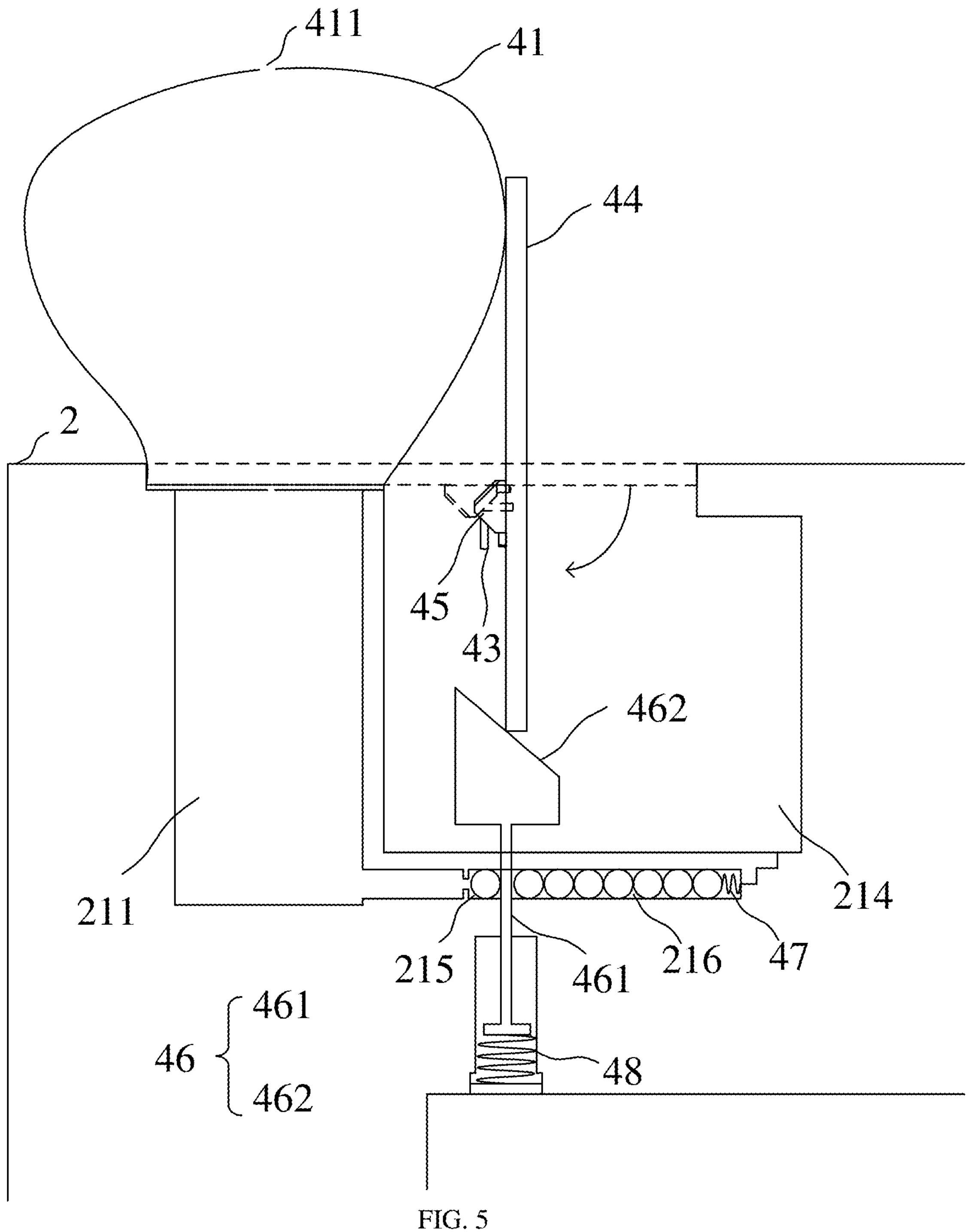
FIG. 5 is a structural schematic view of a protection housing and a protection assembly after a fall occurs according to some embodiments of the present disclosure.

As shown in FIG. 5, FIG. 5 is a structural schematic view of a protection housing and a protection assembly after a fall occurs according to some embodiments of the present disclosure.

The cooperating chamber 21 may include an accommodating chamber 214 adjacent to the gas chamber 211, and an opening of the accommodating chamber 214 faces the same direction as the opening of the gas chamber 211, both of the openings face one side of the protection housing 2 in contact with the external environment. The protection assembly 4 may include a protection cover 44 and a rotating rod 45. The protection cover 44 is located on one side of the compressible airbag 41 away from the gas chamber 211, and at least partially covers the opening of the accommodating chamber 214. The rotating rod 45 is located at the opening of the accommodating chamber 214, and the protection cover 44 is rotatably connected to the protection housing 2 through the rotating rod 45. The protection cover 44 is configured to rotate in a direction indicated by the arrow in FIG. 5 under the compression of the compressible airbag 41 after inflation, so that a part of the protection cover 44 is located in the accommodating chamber 214.

The accommodating chamber 214 is configured to accommodate the part of the protection cover 44 compressed by the compressible airbag 41 into the accommodating chamber 214 after the compressible airbag 41 is inflated and expands. The rotating rod 45 is configured to enable the part of the protection cover 44 compressed by the compressible airbag 41 to rotate into the accommodating chamber 214 through the rotating rod 45 after the compressible airbag 41 is inflated and expands. The protection cover 44 is configured to be served as an outer covering to provide additional protection for the compressible airbag 41 when the compressible airbag 41 is not in use, thereby avoiding damage to the compressible airbag 41 due to external collisions and scratches. Further, the protection cover 44 may be configured to prevent dust, bacteria, insects and other external substances from entering the accommodating chamber 214 and the cooperating chamber 21, maintaining the normal use of the protection assembly 4.

For example, when the fall occurs, the compressible airbag 41 is inflated and expands to compress the protection cover 44 located above the compressible airbag 41 and the openings of the accommodating chamber 214. The protection cover 44 located above the compressible airbag 41 and the openings of the accommodating chamber 214 rotates, under the compression of the compressible airbag 41, in the direction indicated by the arrow in FIG. 5 through the rotating rod 45. The protection cover 44 partially covering the openings of the accommodating chamber 214 is rotated into the accommodating chamber 214 through the rotating rod 45. When the protection cover 44 is perpendicular to the openings of the accommodating chamber 214, the rotation stops, and the compressible airbag 41 is fully ejected into the external environment, achieving protection for the display panel 5.

In the above solutions, the protection cover 44 above the compressible airbag 41 and the opening of the accommodating chamber 214 may protect the compressible airbag 41, the accommodating chamber 214, and the cooperating chamber 21 when the display panel 5 works normally, and maintain the normal use of the protection assembly 4. Moreover, the rotating rod 45 may enable the protection cover 44 located above the compressible airbag 41 to rotate to the opening of the accommodating chamber 214 when the fall occurs, providing sufficient space for the expanded compressible airbag 41 to maintain the compressible airbag 41 to work normally.

Please continue to refer to FIG. 5. The protection assembly 4 may include a reset spring 43, which is connected to the rotating rod 45 and is configured to drive the protection cover 44 to rotate to one side of the compressible airbag 41 away from the gas chamber 211 after the compressible airbag 41 shrinks.

For example, when the fall occurs, the compressible airbag 41 is successfully ejected to protect the display panel 5, then excess gas in the compressible airbag 41 is deflated through the gas leakage hole 411, and the compressible airbag 41 return to an uninflated and unexpanded state under its own elastic force. After the compressible airbag 41 returns to its uninflated and unexpanded state, the compression of the compressible airbag 41 on the protection cover 44 disappears. The protection cover 44 gradually rotates towards the side of the compressible airbag 41 away from the gas chamber 211 under a pulling force of the reset spring 43, until the protection cover 44 returns to its original position on the side of the compressible airbag 41 away from the gas chamber 211.

In the above solutions, the reset spring 43 is arranged in the protection assembly 4, the protection cover 44, compressed into the accommodating chamber 214 by the inflated and expanded compressible airbag 41, may be reset after the compressible airbag 41 is successfully activated and then returns to the uninflated and unexpanded state, so as to protect the protection assembly 4 and maintain subsequently normal use of the protection assembly 4.

Figure 6:
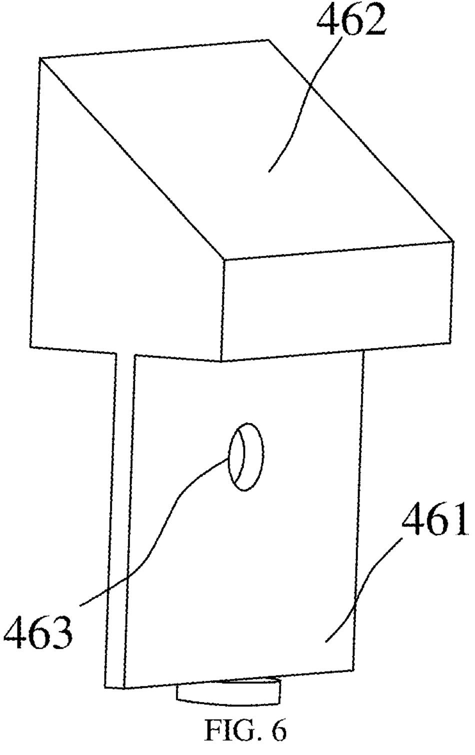
FIG. 6 is a structural schematic view of a material filling gate in a protection assembly according to some embodiments of the present disclosure.

As shown in FIGS. 5 and 6, FIG. 6 is a structural schematic view of a material filling gate in a protection assembly according to some embodiments of the present disclosure.

The protection assembly 4 may include a material filling gate 46, which includes a gate plate 461 and an abutting member 462.

The gate plate 461 may include a material hole 463, and the gate plate 461 penetrates the storage space 212 and extends into the accommodating chamber 214. The abutting member 462 is located in the accommodating chamber 214 and connected to the gate plate 461. The storage space 212 is located on one side of the accommodating chamber 214 away from the opening of the accommodating chamber 214, and extends in a direction away from the gas chamber 211.

The gate plate 461 may be made of a metal material, such as steel, or aluminum, etc. with excellent strength and durability. The shape of gate plate 461 may be but is not limited to be rectangular, or square, etc. The shape and material of gate plate 461 may be selected according to a usage environment, an application requirement, budget, and other factors. The gate plate 461 is configured to divide the storage space 212 into an ignition chamber 215 and a storage chamber 216. The ignition chamber 215 is communicated with the gas chamber 211, and is configured to transmit the gas generated in the ignition chamber 215 to the gas chamber 211. The ignition chamber 215 is connected to one end of the ignition leading-wire 31. The ignition chamber 215 is configured to: receive the fall signal transmitted by the ignition leading-wire 31 when the ignition leading-ball 32 senses the fall of the display panel 5 and contacts with and enable the ignition leading-wire 31, and then the ignition chamber 215 is configured to perform ignition processing. The abutting member 462 may be a wedge-shaped structure or a structure similar to the wedge-shaped structure that utilizes an inclined surface to transmit force or fix an object. For example, in some embodiments of the present disclosure, the use of the abutting member 462 to transmit force or fix an object is as follows. When the fall occurs, the compressible airbag 41 is inflated and expands to compress the protection cover 44 located above the compressible airbag 41 and the opening of the accommodating chamber 214. The protection cover 44 rotates under the compression effect of the inflated compressible airbag 41, and the protection cover 44 partially covering the opening of the accommodating chamber 214 rotates, through the rotating rod 45, into the accommodating chamber 214 to abut against the abutting member 462, causing the gate plate 461 to move in a direction away from the opening of the accommodating chamber 214, further causing the ignition chamber 215 to be communicated with the storage chamber 216 through the material hole 463, such that the ignition material 42 in the storage chamber 216 enters the ignition chamber 215 through the material hole 463.

In the above solutions, the material filling gate 46 may divide the storage space 212 into ignition chamber 215 and storage chamber 216 when the display panel 5 does not fall, such that only one ignition material 42 is ignited in the ignition chamber 215 when the fall occurs, thereby avoiding the waste of the ignition material 42 and maintaining the safety of the ignition chamber 215. Moreover, the material hole 463 is defined on the gate plate 461, when the fall occurs, the protection cover 44 partially covering the opening of the accommodating chamber 214 may abut against the abutting member 462 to transmit force to the material filling gate 46, such that the ignition chamber 215 is communicated with the storage chamber 216 through the material hole 463.

Please continue to refer to FIG. 5. The protection assembly 4 may include a pushing elastic member 47, which is located on one side of the storage chamber 216 away from the ignition chamber 215.

For example, when the fall occurs, the compressible airbag 41 is inflated and expands, then one end of the protection cover 44 away from the gas chamber 211 rotates through the rotating rod 45 in the direction indicated by the arrow in FIG. 5 to abut against the abutting member 462 in the accommodating chamber 214, causing the gate plate 461 to move in the direction away from the opening of the accommodating chamber 214, further causing the ignition chamber 215 to be communicated with the storage chamber 216 through the material hole 463. Under the action of elasticity, the pushing elastic member 47 pushes the ignition material 42 into the ignition chamber 215 through the material hole 463 to complete automatic feeding of the ignition material 42.

Please continue to refer to FIG. 5. The protection assembly 4 may include a gate elastic member 48, which is located on one side of the storage space 212 away from the opening of the accommodating chamber 214. The gate elastic member 48 is connected to the gate plate 461.

For example, when the fall occurs, the compressible airbag 41 is successfully ejected to protect the display panel 5, then the excess gas in the compressible airbag 41 is deflated through the gas leakage hole 411, and the compressible airbag 41 returns to the uninflated and unexpanded state under its own elastic force. Then the protection cover 44 returns to its original position on the side of the compressible airbag 41 away from the gas chamber 211, such that the force of the protection cover 44 on the abutting member 462 disappears, and the material filling gate 46 moves towards the direction close to the opening of the storage chamber 214 under the elastic force of the gate elastic member 48. The passing hole 463 detaches from the storage space 212, and the ignition chamber 215 and the storage chamber 216 are spaced apart from each other again through the gate plate 461.

In the above solutions, the material filling gate 46 may return to the position before the fall occurs through the gate elastic member 48. After completing the automatic feeding of the ignition material 42, the ignition chamber 215 and the storage chamber 216 may be spaced apart from each other through the gate plate 461, such that a preparation work for the protection assembly 4 in the next fall is completed.

Figure 7:
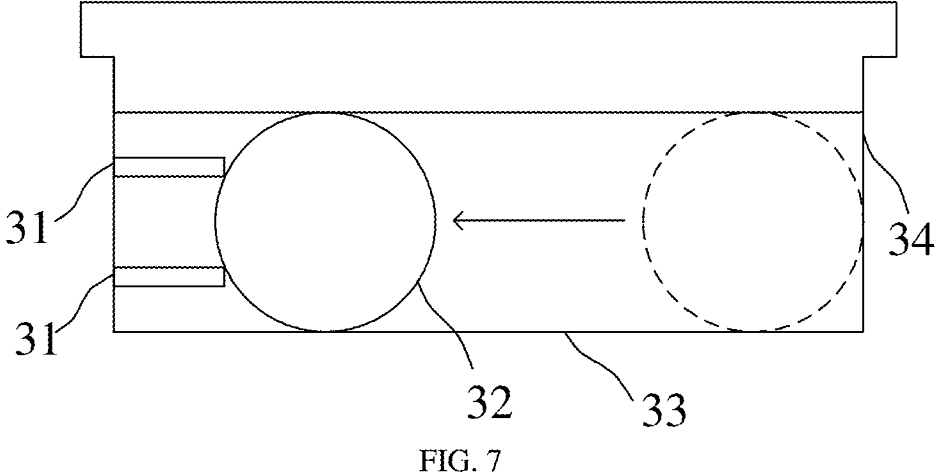
FIG. 7 is a structural schematic view of an ignition assembly after a fall occurs according to some embodiments of the present disclosure.

As shown in FIG. 7, FIG. 7 is a structural schematic view of an ignition assembly after a fall occurs according to some embodiments of the present disclosure.

The protection housing 2 may include a sliding track 33. One end of the ignition leading-wire 31 configured to contact with the ignition leading-ball 32 extends into the sliding track 33. The sliding track 33 has a magnetic wall 34 on one side away from the ignition leading-wire 31, and the magnetic wall 34 is configured to magnetically attract the ignition leading-ball 32.

For example, when the display panel 5 falls, the ignition leading-ball 32 detaches from the magnetic wall 34 under its own gravity. The ignition leading-ball 32 moves towards the ignition leading-wire 31 in the direction indicated by the arrow in FIG. 7 through the sliding track 33, contacts with and enables the ignition leading-wire 31.

In the above solutions, the sliding track 33 is arranged in the protection housing 2 and the magnetic wall 34 is arranged on the side of the sliding track 33 away from the ignition leading-wire 31, such that the ignition leading-ball 32 may detach from the magnetic wall 34 under the action of gravity, contact with and enable the ignition leading-wire 31 when the fall occurs, and the fall signal is transmitted to the ignition chamber 215 through the ignition leading-wire 31, achieving sensing the fall.

Figures 8, 9:
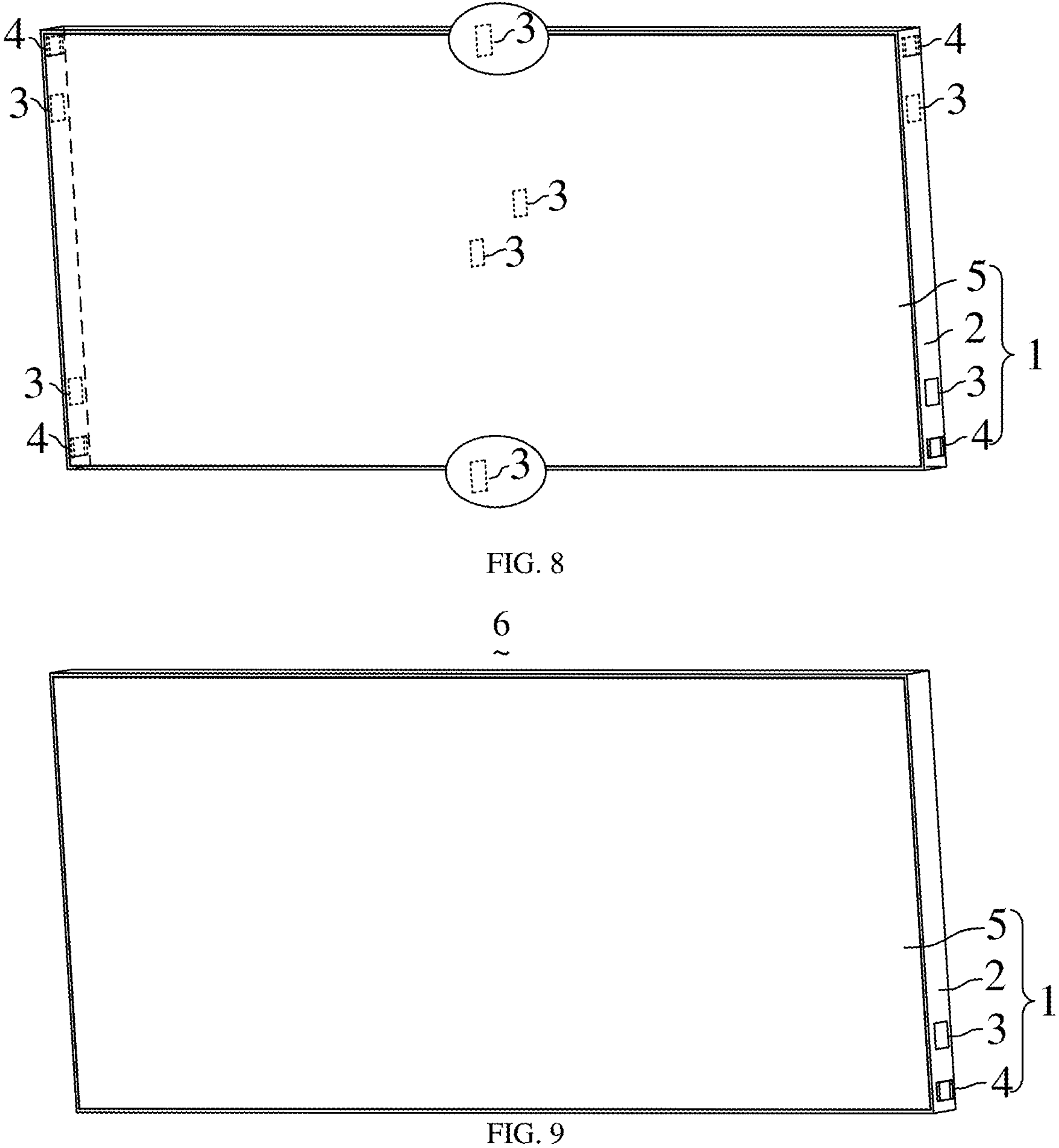
FIG. 8 is a structural schematic view of a display apparatus according to some embodiments of the present disclosure.
FIG. 9 is a structural schematic view of an electronic device according to some embodiments of the present disclosure.

As shown in FIG. 8, FIG. 8 is a structural schematic view of a display apparatus according to some embodiments of the present disclosure.

The display apparatus 1 has multiple protection assemblies 4 and cooperating chamber 21, and the multiple protection assemblies 4 and cooperating chamber 21 spaced apart from each other, and/or the number of the ignition assembly 3 is multiple.

For example, the display apparatus 1 in some embodiments of the present disclosure may include protection assemblies 4 at the four corners of the display panel 5. Each of the protection assemblies 4 is configured with a corresponding cooperating chamber 21. In addition, the display apparatus 1 in some embodiments of the present disclosure may include ignition assemblies 3 in the six positions of top, bottom, left side, right side, front side, and back side. When a ignition leading-ball 32 of the ignition assemblies 3 in any one of the six positions of top, bottom, left side, right side, front side, and back side senses that the display panel 5 falls, ignition materials 42 in the protection assemblies 4 at the four corners of the display panel 5 are ignited, such that the protection assembly 4 may provide anti fall protection for the four corners of the display panel 5.

In the above solutions, the multiple protection assemblies 4 and cooperating chambers 21 are arranged on the four corners of display panel 5, and the ignition assemblies 3 connected to each other in parallel in the six positions of top, bottom, left side, right side, front side, and back side of display apparatus 1. When the fall occurs, the ignition assemblies 3 may sense the fall in all directions. When one of the ignition assemblies 3 senses the fall, the multiple protection assemblies 4 are controlled to act simultaneously, thereby improving the anti fall effect of display apparatus 1 on display panel 5.

As shown in FIG. 9, FIG. 9 is a structural schematic view of an electronic device according to some embodiments of the present disclosure.

Some embodiments of the present disclosure provide an electronic device 6, which may include the display apparatus 1 as described above.

In some embodiments, the electronic device 6 may include a power supply configured to power the display apparatus 1.

For example, the electronic device 6 may be a mobile phone, a tablet, a computer with wireless transmission and reception capabilities, or a virtual reality (VR) device, an augmented reality (AR), a television, a laptop, a smartwatch, a game console, a car display, a digital camera, a monitor, a billboard, or a navigation system, etc.

The embodiments of the present disclosure explain the principles and implementation methods of the present disclosure. The above embodiments are only configured to help understand the methods and core ideas of the present disclosure. In addition, those skilled in the art may change specific implementation methods and application scope based on the ideas of the present disclosure. In summary, the content of this specification should not be understood as a limitation on the present disclosure.

What is claimed is:

1. A display apparatus, comprising: a display panel, a protection housing, an ignition assembly, and a protection assembly;

wherein the display panel is arranged in the protection housing, and the protection housing comprises a cooperating chamber, the protection assembly comprises a compressible airbag and an ignition material, the cooperating chamber comprises a gas chamber and a storage space, the gas chamber is communicated with the storage space, the storage space is configured to accommodate the ignition material, and the compressible airbag seals an opening of the gas chamber;

the ignition assembly is connected to the protection housing, the ignition assembly comprises an ignition leading-wire and an ignition leading-ball, one end of the ignition leading-wire is connected to the storage space, and the ignition leading-ball is configured to contact with the other end of the ignition leading-wire when a fall is sensed to ignite the ignition material, so as to increase the air pressure in the gas chamber to inflate the compressible airbag;

wherein the cooperating chamber comprises an accommodating chamber adjacent to the gas chamber, an opening of the accommodating chamber faces the same direction as the opening of the gas chamber, the protection assembly comprises a protection cover and a rotating rod, the protection cover is located on one side of the compressible airbag away from the gas chamber, the protection cover at least partially covers the opening of the accommodating chamber, the rotating rod is located at the opening of the accommodating chamber, the protection cover is rotationally connected to the protection housing through the rotating rod, and the protection cover is configured to rotate under an action of the compressible airbag after inflation, such that a part of the protection cover is located in the accommodating chamber;

wherein the compressible airbag comprises a gas leakage hole configured to the deflate gas in the compressible airbag; and wherein the protection assembly comprises a reset spring connected to the rotating rod, and the reset spring is configured to drive the protection cover to rotate to the side of the compressible airbag away from the gas chamber after the compressible airbag shrinks.

2. The display apparatus according to claim 1, wherein the storage space is located on one side of the accommodating chamber away from the opening of the accommodating chamber, the storage space extends in a direction away from the gas chamber, the protection assembly comprises a material filling gate, the material filling gate comprises a gate plate and an abutting member, the gate plate penetrates the storage space and extends into the accommodating chamber, the abutting member is located in the accommodating chamber and connected to the gate plate, the gate plate is configured to divide the storage space into an ignition chamber and a storage chamber, the ignition chamber is communicated with the gas chamber, and the one end of the ignition leading-wire is connected to the ignition chamber;

the gate plate comprises a material hole, and the protection cover is configured to rotate under an action of the inflated airbag and enable the part of the protection cover located in the accommodating chamber to abut against the abutting member, such that the gate plate moves in a direction away from the opening of the accommodating chamber to enable the ignition chamber to be communicated with the storage chamber through the material hole, causing the ignition material in the storage chamber to enter the ignition chamber through the material hole.

3. The display apparatus according to claim 2, wherein the protection assembly comprises a pushing elastic member, the pushing elastic member is located on one side of the storage chamber away from the ignition chamber, and the pushing elastic member is configured to push the ignition material into the ignition chamber through the material hole.

4. The display apparatus according to claim 2, wherein the protection assembly comprises a gate elastic member, the gate elastic member is located on one side of the storage space away from the opening of the accommodating chamber, and the gate elastic member is connected to the gate plate and is configured to push the material filling gate to move towards a direction close to the opening of the accommodating chamber until the material hole detaches from the storage space.

5. The display apparatus according to claim 1, wherein the protection housing comprises a sliding track, the other end of the ignition leading-wire configured to contact with the ignition leading-ball extends into the sliding track, the sliding track comprises a magnetic wall on one side away from the ignition leading-wire, the magnetic wall is configured to magnetically attract the ignition leading-ball, the ignition leading-ball is configured to detach from the magnetic wall under its own gravity to contact with the ignition leading-wire.

6. The display apparatus according to claim 1, wherein the number of the protection assembly and the cooperating chamber is a plurality, and the plurality of the protection assemblies and the cooperating chambers are spaced apart from each other.

7. The display apparatus according to claim 1, wherein the number of the ignition assemblies is a plurality, each of the plurality of ignition assemblies is configured to ignite the corresponding ignition material.

8. An electronic device, comprising a display apparatus and a power supply;

wherein the power supply is configured to power the display apparatus;

the display apparatus comprises a display panel, a protection housing, an ignition assembly, and a protection assembly;

wherein the display panel is arranged in the protection housing, and the protection housing comprises a cooperating chamber, the protection assembly comprises a compressible airbag and an ignition material, the cooperating chamber comprises a gas chamber and a storage space, the gas chamber is communicated with the storage space, the storage space is configured to accommodate the ignition material, and the compressible airbag seals an opening of the gas chamber;

the ignition assembly is connected to the protection housing, the ignition assembly comprises an ignition leading-wire and an ignition leading-ball, one end of the ignition leading-wire is connected to the storage space, and the ignition leading-ball is configured to contact with the other end of the ignition leading-wire when a fall is sensed to ignite the ignition material, so as to increase the air pressure in the gas chamber to inflate the compressible airbag;

wherein the cooperating chamber comprises an accommodating chamber adjacent to the gas chamber, an opening of the accommodating chamber faces the same direction as the opening of the gas chamber, the protection assembly comprises a protection cover and a rotating rod, the protection cover is located on one side of the compressible airbag away from the gas chamber, the protection cover at least partially covers the opening of the accommodating chamber, the rotating rod is located at the opening of the accommodating chamber, the protection cover is rotationally connected to the protection housing through the rotating rod, and the protection cover is configured to rotate under an action of the compressible airbag after inflation, such that a part of the protection cover is located in the accommodating chamber;

wherein the compressible airbag comprises a gas leakage hole configured to the deflate gas in the compressible airbag;

wherein the protection assembly comprises a reset spring connected to the rotating rod, and the reset spring is configured to drive the protection cover to rotate to the side of the compressible airbag away from the gas chamber after the compressible airbag shrinks.

9. The electronic device according to claim 8, wherein the storage space is located on one side of the accommodating chamber away from the opening of the accommodating chamber, the storage space extends in a direction away from the gas chamber, the protection assembly comprises a material filling gate, the material filling gate comprises a gate plate and an abutting member, the gate plate penetrates the storage space and extends into the accommodating chamber, the abutting member is located in the accommodating chamber and connected to the gate plate, the gate plate is configured to divide the storage space into an ignition chamber and a storage chamber, the ignition chamber is communicated with the gas chamber, and the one end of the ignition leading-wire is connected to the ignition chamber;

the gate plate comprises a material hole, and the protection cover is configured to rotate under an action of the inflated airbag and enable the part of the protection cover located in the accommodating chamber to abut against the abutting member, such that the gate plate moves in a direction away from the opening of the accommodating chamber to enable the ignition chamber to be communicated with the storage chamber through the material hole, causing the ignition material in the storage chamber to enter the ignition chamber through the material hole.

10. The electronic device according to claim 9, wherein the protection assembly comprises a pushing elastic member, the pushing elastic member is located on one side of the storage chamber away from the ignition chamber, and the pushing elastic member is configured to push the ignition material into the ignition chamber through the material hole.

11. The electronic device according to claim 9, wherein the protection assembly comprises a gate elastic member, the gate elastic member is located on one side of the storage space away from the opening of the accommodating chamber, and the gate elastic member is connected to the gate plate and is configured to push the material filling gate to move towards a direction close to the opening of the accommodating chamber until the material hole detaches from the storage space.

12. The electronic device according to claim 8, wherein the protection housing comprises a sliding track, the other end of the ignition leading-wire configured to contact with the ignition leading-ball extends into the sliding track, the sliding track comprises a magnetic wall on one side away from the ignition leading-wire, the magnetic wall is configured to magnetically attract the ignition leading-ball, the ignition leading-ball is configured to detach from the magnetic wall under its own gravity to contact with the ignition leading-wire.

13. The electronic device according to claim 8, wherein the number of the protection assembly and the cooperating chamber is a plurality, and the plurality of the protection assemblies and the cooperating chambers are spaced apart from each other.

14. The electronic device according to claim 8, wherein the number of the ignition assemblies is a plurality, each of the plurality of ignition assemblies is configured to ignite the corresponding ignition material.

* * * * *